United States Patent [19]

Kober et al.

[11] Patent Number: 4,626,462
[45] Date of Patent: Dec. 2, 1986

[54] PROCESS FOR THE MANUFACTURE OF THROUGH-HOLE CONTACTED FLEXIBLE CIRCUIT BOARDS FOR HIGH BENDING STRESSES AND THE CIRCUIT BOARDS MADE THEREFROM

[75] Inventors: Horst Kober, Marburg; Gunter Trogisch, Seeheim-Jugenheim, both of Fed. Rep. of Germany

[73] Assignee: Firma Carl Freundenberg, Fed. Rep. of Germany

[21] Appl. No.: 775,916

[22] Filed: Sep. 13, 1985

[30] Foreign Application Priority Data

Sep. 21, 1984 [DE] Fed. Rep. of Germany ....... 3434672

[51] Int. Cl.$^4$ .............................................. B32B 3/10
[52] U.S. Cl. ..................................... 428/137; 156/291; 156/630; 156/644; 174/68.5; 339/17 A; 339/17 B; 361/398; 428/195; 428/209; 428/901
[58] Field of Search ....................... 156/291, 630, 644; 174/68.5; 339/17 A, 17 B; 361/398; 428/137, 195, 209, 901

[56] References Cited

U.S. PATENT DOCUMENTS

| | | | |
|---|---|---|---|
| 4,103,102 | 7/1978 | Klein | 174/68.5 |
| 4,141,614 | 2/1979 | Piccirillo | 339/17 F |
| 4,311,749 | 1/1982 | Hiraiwa et al. | 428/209 |
| 4,496,794 | 1/1985 | Darms et al. | 174/68.5 |
| 4,528,064 | 7/1985 | Ohsawa et al. | 156/630 |
| 4,562,119 | 12/1985 | Darms et al. | 428/901 X |

Primary Examiner—Robert A. Dawson
Attorney, Agent, or Firm—Fishman & Dionne

[57] ABSTRACT

A multi-layer through-hole contacted flexible circuit board and method of manufacture thereof is presented having a laminar construction which is strictly symmetrical in the bending area; and which have no exposed adhesive. Registration holes are first introduced in a copper-laminated base material, then, avoiding the bending area, with the aid of the registration holes, an adhesive layer is applied to the non-conductive film carrier of the base material. Next, a second copper foil is placed on the adhesive layer. Thereafter, all of the layers are laminated. This is followed by the formation of through-holes in the area surrounding the bending area while circuit patterns are formed in the flexible or bending area (the registration holes again providing assistance in positioning). The spaces between the circuit pattern, as well as the entire copper foil, is then etched away in the bending area, and, finally, all the conducting path areas are covered with non-conductive cover film. As a result, the conducting paths are located in the "neutral section", that is, the area of the flexible circuit board which is neutral with respect to the forces generated during bending.

20 Claims, 3 Drawing Figures

PROCESS FOR THE MANUFACTURE OF THROUGH-HOLE CONTACTED FLEXIBLE CIRCUIT BOARDS FOR HIGH BENDING STRESSES AND THE CIRCUIT BOARDS MADE THEREFROM

BACKGROUND OF THE INVENTION

This invention relates to a process for the manufacture of through-hole contacted flexible circuit boards which are suited for high bending stresses and the circuit boards derived therefrom.

Flexible circuit elements are commonly used in electronic components that are subjected to high dynamic bending stresses, such as, for example, in disk storages and printers. These flexible circuit elements must have a smooth and extremely clean surface, in order to avoid disturbances of the electromechanical functions (of the disc drive or other electronic component) as the result of particles released from the flexible circuit board; particularly particles released from the adhesive materials used in manufacturing the flexible circuitry.

Circuit boards for high bending stresses which have two circuit layers with through-hole contacts located outside the bending area, are usually designed to be flexible on one side and to have carrier and covering films of equal thickness (symmetrical laminar construction). The base material used is a carrier film, made, for example, of polyimide, with copper-laminated on both sides thereof. Generally, the copper layer or foil is attached to the carrier film by means of an adhesive layer. The formation of through-hole contacts and a conductive pattern (on the copper foil) is accomplished in a conventional manner by a subtraction process (etching). As a result, in the bending area, the conducting paths (circuit pattern) are formed on only one side thereof, and the other side is completely etched away. The conductors are then provided with a protective covering film, of the same thickness as the carrier film.

Despite the apparent symmetrical construction of the above-described flexible circuits, the conducting paths thereon are not located in the transverse section of the laminate that remains "neutral" when subjected to bending stress, that is, the section that is neither subjected to tensile or compressive strains (the "neutral section"). In fact, the adhesive layer of the carrier film (which has been etched away) will produce an asymmetry, which acts to displace the neutral section into other transverse areas. In addition, as a result of the exposed adhesive, the circuit board is liable to accumulate dust and to be subjected to abrasion and thereby contaminate the electronic component.

Attempts have also been made in the manufacture of the above-described flexible circuits to make the carrier film of the base material only half as thick as the covering film on the printed circuit side.

Also, a covering film with the same thickness as the carrier film has been applied on the side of the carrier film that is etched away. While this particular construction has no exposed adhesive, unfortunately, it is still impossible to achieve a strict symmetry in the bending area, which is attributable to the existence of the two layers of adhesive on the carrier film. Furthermore, the total thickness of the construction in the bending area cannot be made thin enough, and consequently flexible enough, as is possible in the case of a one-sided circuit board.

SUMMARY OF THE INVENTION

The above-discussed and other problems and deficiencies of the prior art are overcome or alleviated by the through-hole contacted flexible circuit board for high bending stresses and method of manufacture thereof of the present invention. In accordance with the present invention, a process is provided wherein through-hole contacted flexible circuit boards for high bending stresses can be manufactured with a strictly symmetrical laminar construction in the bending area. In that area, the conducting paths (circuit pattern) are located in the "neutral section" described above. Significantly, there are no exposed layers of adhesive in the bending area which could act as a contaminant.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1:
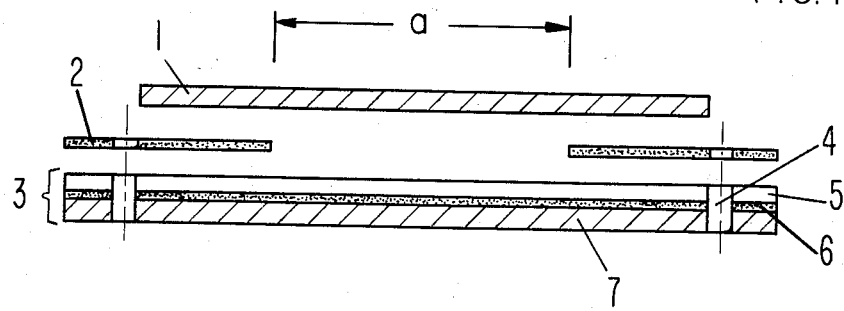
FIG. 1 is a cross-sectional elevation view, partially exploded, showing the construction of the flexible circuit manufactured in accordance with the present invention, prior to the formation of the through-hole contacts and the circuit pattern.
Figure 2:
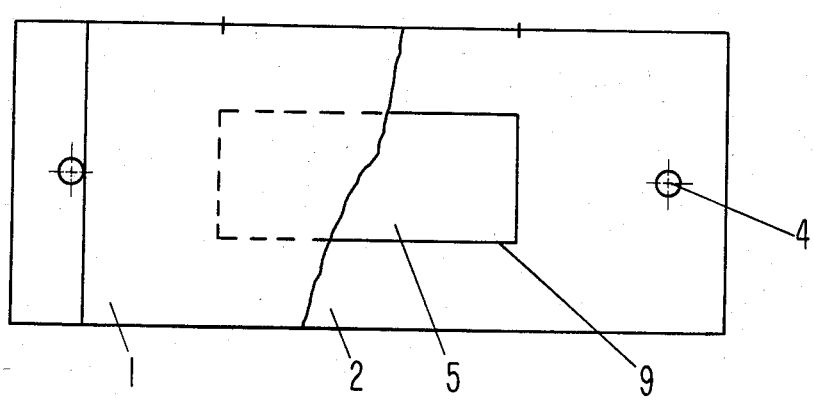
FIG. 2 is a plan view of the laminate shown in FIG. 1.

The manufacturing process in accordance with the present invention consists, in the first step, of providing a means of alignment such as registration holes 4 to a flexible base material 3. Base material 3 usually comprises a circuit laminate consisting of a conductive foil 7, preferably made of copper, a non-conductive carrier film 5 and an adhesive layer 6 sandwiched between conductive foil 7 and non-conductive carrier film 5. In the next step, an adhesive layer 2 is applied to the carrier film 5 of base material 3 with care to avoid the deposition of any adhesive 2 on the bending or flexing area "a". Adhesive layer 2 may comprise an adhesive film or a non-flowing prepreg. The resulting space or region 9 in adhesive layer 2 on base material 3 is determined with the aid of the alignment means, i.e., registration holes 4. Subsequently, an upper copper layer or foil 1 is placed on the upper adhesive layer 2. This construction, as shown in FIG. 1, is now laminated under heat and pressure to form a flexible laminate unit.

The further processing of this laminate unit takes place in the following manner:

Contact through-holes 10 are selectively formed at locations outside the bending or flexing region "a". The positions of through-holes 10, which are to be located outside the bending area "a", (and those of the circuit patterns which must be formed within the bending area "a" above the empty space 9), can be accurately determined with the aid of the registration holes 4 or other alignment means and formed via the use of conventional masking techniques. Next, the conductive (copper) foil 1 that has been laminated on top of adhesive 2 (and which has been provided with masks for the formation of conductive through-holes and circuit traces) is etched away in the bending area "a", at the same time that the circuit pattern is formed, so that carrier film 5 of base material 3 is exposed. Finally, an upper covering film 8 and a lower covering film 11 are applied to the conducting areas 1 and 7, respectively via respective adhesive layers 12 and 13. In the embodiment shown in the FIGURES, upper covering film 8 and adhesive layers 12 have the same total thickness as carrier film 5 and adhesive layer 6.

Figure 3:
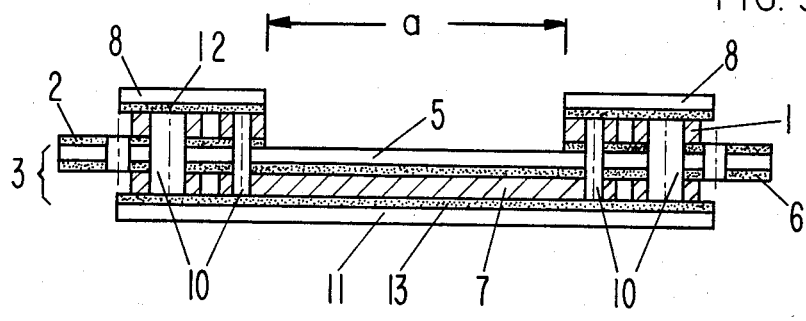
FIG. 3 is a cross-sectional elevation view of the circuit board manufactured in accordance with the invention, subsequent to through-hole forming and circuit pattern formation.

As is shown in FIG. 3, after the manufacturing steps described hereinabove, the circuit paths of the dynamically stressed bending area "a" are located in the "neutral section", that is, in the area that is neutral with respect to the forces generated during bending; and the surface of the circuit board is protected by a covering film 8 or a carrier film 5, neither of which has any exposed adhesive layer. Another important feature of the present invention is that the cross section of the circuit board is strictly symmetrical in its construction within the bending area "a".

In accordance with the present invention, it is possible to manufacture, at reasonable cost, through-hole contacted flexible circuit boards which perform at least as well as the well known one-sided circuit boards, in terms of their bending characteristics; particularly when subjected to dynamic stresses. Moreover, the present invention contains the additional features and advantages of (1) locating the circuit patterns in the "neutral section" "a"; (2) no exposed adhesive layers, and therefore less chance for contamination of the electronic component; and (3) symmetry of construction within the dynamically stressed bending area "a".

While the present invention has been discussed in terms of a two (2) layer flexible circuit, it will be appreciated that the process described herein can equally form a circuit having three (3) or more layers. For example, in the case of a three layer circuit, an additional adhesive layer and conductive foil would be laminated to bottom covering film 11 (FIG. 3). Importantly, as was discussed with regard to adhesive layer 2, a second space or region corresponding to space 9 in region "a" would have no adhesive applied thereto. Thus, following an etching or similar subtractive step, the conductive foil would be etched away from this second space or region along with the formation of a circuit pattern. As a result, a symmetrical three layer flexible circuit of the type described above would be formed.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of manufacturing a flexible circuit element comprising the steps of:
   forming a first flexible non-conductive carrier film;
   forming a first conductive layer;
   providing a first adhesive layer between said first carrier film and said first conductive layer;
   laminating said first carrier film, first adhesive layer and first conductive layer to form a flexible base laminate;
   selectively providing a second adhesive layer to portions of said first carrier film of said flexible base laminate whereby at least one area on said first carrier film has no adhesive and defines a bending region; and
   providing a second conductive layer on said second adhesive layer whereby said bending region is covered by said second conductive layer and defines a space; and
   laminating said flexible base laminate, second adhesive layer and second conductive layer to define a flexible laminate unit.

2. The method of claim 1 including the steps of:
   forming at least one conductive through-hole in said flexible laminate unit in a location outside of said bending region; and
   forming a circuit pattern in said second conductive layer, a portion of said circuit pattern being formed over said space.

3. The method of claim 2 including the step of:
   removing the portion of said second conductive layer over said space to expose some of said first carrier film.

4. The method of claim 3 including the steps of:
   providing a third adhesive layer to the unremoved second conductive layer; and
   providing an upper non-conductive covering film on said third adhesive layer.

5. The method of claim 3 including the steps of:
   providing a fourth adhesive layer to the first conductive layer; and
   providing a lower non-conductive covering film on said fourth adhesive layer.

6. The method of claim 4 including the steps of:
   providing a fourth adhesive layer to the first conductive layer; and
   providing a lower non-conductive covering film on said fourth adhesive layer.

7. The method of claim 4 wherein:
   said upper covering film and third adhesive layer have a total thickness about equal to the total thickness of said first carrier film and said first adhesive layer.

8. The method of claim 6 wherein:
   said upper covering film and third adhesive layer have a total thickness about equal to the total thickness of said first carrier film and said first adhesive layer.

9. The method of claim 3 wherein:
   said step of removing the portion of said second conductive layer over said space is simultaneous with said step of forming said circuit pattern.

10. The method of claim 3 wherein:
    said step of removing the portion of said second conductive layer over said space is accomplished by etching.

11. A flexible circuit element formed in a method of manufacturing comprising the steps of:
    forming a first flexible non-conductive carrier film;
    forming a first conductive layer;
    providing a first adhesive layer between said first carrier film and said first conductive layer;
    laminating said first carrier film, first adhesive layer and first conductive layer to form a flexible base laminate;
    selectively providing a second adhesive layer to portions of said first carrier film of said flexible base laminate whereby at least one area on said first carrier film has no adhesive and defines a bending region; and providing a second conductive layer on said second adhesive layer whereby said bending region is covered by said second conductive layer and defines a space; and laminating said flexible base laminate, second adhesive layer and second conductive layer to define a flexible laminate unit.

12. The circuit element of claim 11 including the steps of:

forming at least one conductive through-hole in said flexible laminate unit in a location outside of said bending region; and forming a circuit pattern in said second conductive layer, a portion of said circuit pattern being formed over said space.

13. The circuit element of claim 12 including the step of:

removing the portion of said second conductive layer over said space to expose some of said first carrier film.

14. The circuit element of claim 13 including the steps of:

providing a third adhesive layer to the unremoved second conductive layer; and providing an upper non-conductive covering film on said third adhesive layer.

15. The circuit element of claim 13 including the steps of:

providing a fourth adhesive layer to the first conductive layer; and providing a lower non-conductive covering film on said fourth adhesive layer.

16. The circuit element of claim 14 including the steps of:

providing a fourth adhesive layer to the first conductive layer; and providing a lower non-conductive covering film on said fourth adhesive layer.

17. The circuit element of claim 14 wherein:

said upper covering film and third adhesive layer have a total thickness about equal to the total thickness of said first carrier film and said first adhesive layer.

18. The circuit element of claim 16 wherein:

said upper covering film and third adhesive layer have a total thickness about equal to the total thickness of said first carrier film and said first adhesive layer.

19. The circuit element of claim 13 wherein:

said step of removing the portion of said second conductive layer over said space is simultaneous with said step of forming said circuit pattern.

20. The circuit element of claim 13 wherein:

said step of removing the portion of said second conductive layer over said space is accomplished by etching.

* * * * *